United States Patent [19]

Strong, III et al.

[11] Patent Number: 4,689,023
[45] Date of Patent: Aug. 25, 1987

[54] PROGRAMMABLE ELECTRICAL CONNECTOR

[75] Inventors: William J. Strong, III, Bristol; John Olyarchik, Jr., Terryville, both of Conn.

[73] Assignee: The Superior Electric Company, Bristol, Conn.

[21] Appl. No.: 769,681

[22] Filed: Aug. 27, 1985

[51] Int. Cl.$^4$ ............................................. H01R 29/00
[52] U.S. Cl. ....................................... 439/189; 310/71; 310/DIG. 6
[58] Field of Search ................. 339/18 R, 18 B, 18 C, 339/18 P; 29/847; 361/409, 410; 310/68 R, 68 D, 71, DIG. 6

[56] References Cited

U.S. PATENT DOCUMENTS

| | | | |
|---|---|---|---|
| 3,021,498 | 2/1962 | Spillar | 339/18 C |
| 3,038,105 | 6/1962 | Brownfield | 339/18 C |
| 3,151,923 | 10/1964 | Bell et al. | 339/18 C |
| 3,378,920 | 4/1968 | Cone | 29/847 |
| 3,728,471 | 4/1973 | Blinkhorn | 361/409 |
| 4,471,158 | 9/1984 | Roberts | 339/18 C |

*Primary Examiner*—Neil Abrams
*Attorney, Agent, or Firm*—John H. Crozier

[57] ABSTRACT

A physically programmable electrical connector 70 has a first plurality of interconnected conductive paths 71-78. A second plurality of conductors 103-110 and a third plurality of leads 71'-78' are connected to the conductive paths. Electrical discontinuities 87-97 are selectively established in some of the conductive paths, such that the conductors become electrically connected to the leads in a predetermined pattern. A single connector design may be used for connecting varying numbers of conductors and leads.

15 Claims, 10 Drawing Figures

FIG. I
(PRIOR ART)
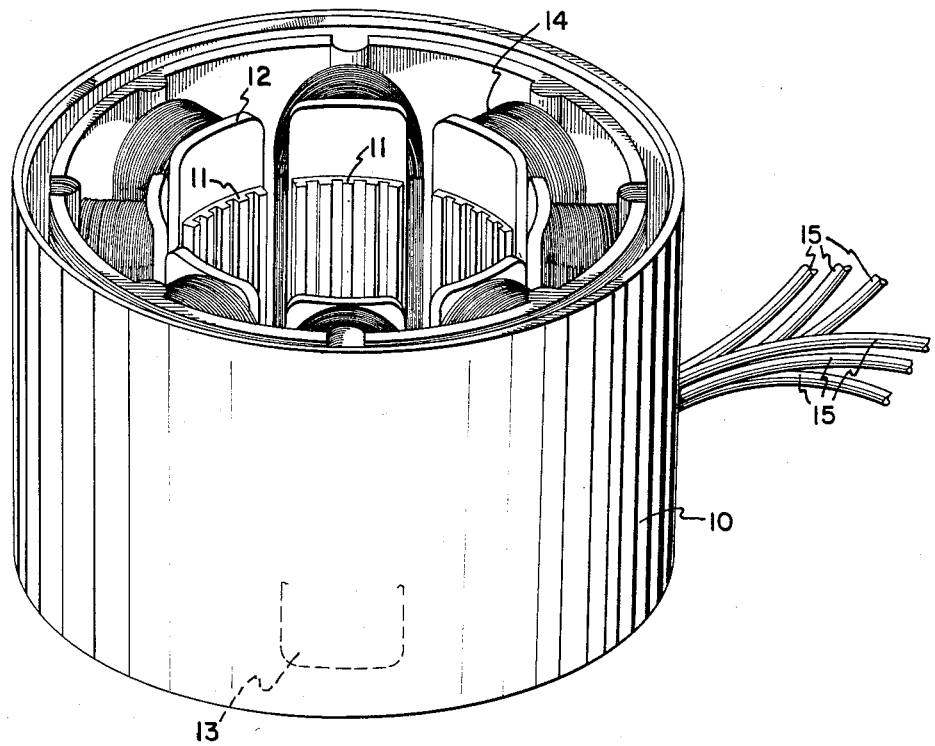
FIG. 2(b)
(PRIOR ART)
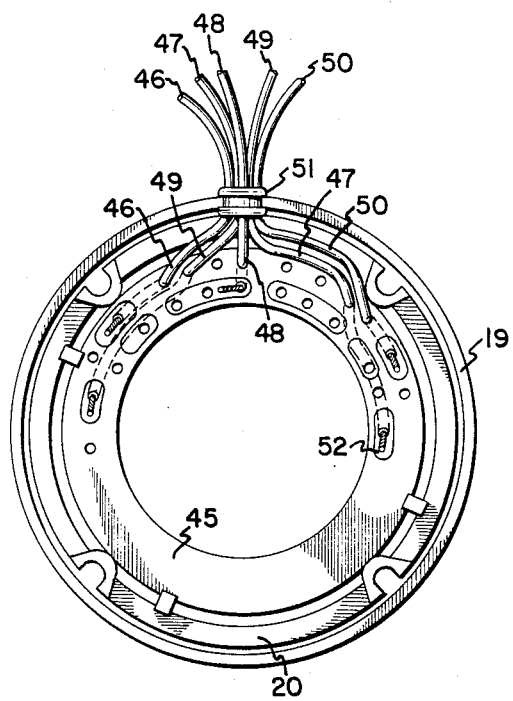
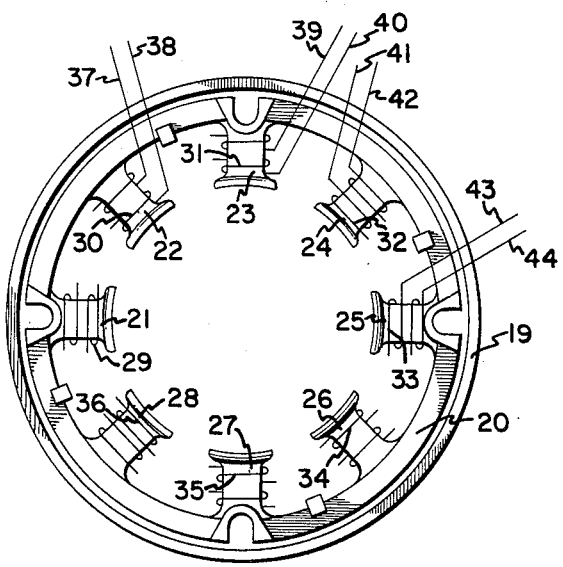
FIG. 2(a)
(PRIOR ART)

| WIRING CONFIGURATION | KNOCKOUT NUMBERS: | 87 | 88 | 89 | 90 | 91 | 92 | 93 | 94 | 95 | 96 | 97 |
|---|---|---|---|---|---|---|---|---|---|---|---|---|
| EIGHT-LEAD, BIFILAR | | o | o | o | o | o | o | o | o | — | — | — |
| SIX-LEAD, BIFILAR | | — | o | — | o | o | o | — | o | o | o | — |
| FIVE-LEAD, BIFILAR | | — | o | — | o | — | o | — | o | o | o | o |
| FOUR-LEAD, MONOFILAR | | o | o | o | o | o | o | — | o | — | — | — |

FIG. 5

PROGRAMMABLE ELECTRICAL CONNECTOR

BACKGROUND OF THE INVENTION

1. Technical Field

This invention relates to electrical connectors, and more particularly to a connector which is physically programmable to connect a set of internal conductors of an electrical device to any set of a plurality of sets of different numbers of external conductors.

2. Background Art

In any of various electrical devices, the device is constructed such that the device includes a set of internal conductors which are to be connected to a set of external conductors and that while the number of internal conductors is fixed for a given model and application of the device, the number of external conductors will be more or less or the same as the number of internal conductors. Included in such devices are motors, particularly stepping motors, multiple-tap transformers, and variable-throw solenoids.

The connections between internal and external conductors may be made with or without some type of interface device. However, whether with or without employing an interface device, the making of such connections has heretofore been relatively time-consuming. Where there is no type of interface device, usually soldered connections between internal and external conductors are made directly, resulting in a mechanically unsatisfactory arrangement, particularly in motors where the connections may be exposed to moving elements of the motor or subject to vibrations or may contact other electrical elements of the motor. Furthermore, where there is provided some type of interface device, or connector, provision must be made by the manufacturer for inventorying different connectors for the different numbers of external conductors and/or relatively complicated hand-wiring of the connector must be employed. This is particularly true of stepping motors wherein connections between internal and external conductors frequently are made on an annular printed circuit board positioned at one end of the stator windings of the motor. There, the internal conductors, or magnet wires, must be hand-routed to the proper soldering pads on the printed circuit board and soldered in place. The external conductors, or lead wires, must also be brought to the proper soldering pads and soldered in place. For a typical two-phase stepping motor having eight magnet wire terminations, there typically may be four, five, six, or eight lead wires. These combinations require that a multipliticy of printed circuit boards be on hand and/or a relatively time-consuming routing of the conductors is required. The manufacture of the printed circuit boards themselves is somewhat involved, requiring the machining of special materials and chemical etching operations. Alternatively, a fixture with provision for mechanical connectors may be employed; however, such an arrangement may also require awkward routing of the wires and may make less-than-satisfactory electrical connections, since resistance could be introduced by oxidation of the connector. Also, there are limitations as to the size of wire that may be accommodated with this type of connector. In any of the above arrangements, the relatively complex routing of the wires and the changing of routings for different numbers of lead wires offers opportunity for human error and makes automated assembly difficult. In addition, the resulting motors, having individual wires as external leads, are difficult to automatically connect in other equipment.

SUMMARY OF THE INVENTION

The present invention substantially avoids the limitations described above by providing a connector which is physically programmable so that a given number of internal conductors may be connected to any set of a plurality of sets of external conductors of different numbers. Furthermore, the connector may be arranged so that the internal and external conductors are always and easily routed to the same position on the conductor thus siimplifying manual assembly and reducing the margin for human error. The simplified arrangement also facilitates the use of automated assembly techniques. Additionally, there are no practical limitations as to the size of wire that may be accommodated.

While the preferred embodiment is hereinafter described as being applied to a stepping motor having a fixed number of internal conductors, it will be understood that it may be applied as well in any case where it is desired to have one connector capable of interconnecting two sets of conductors of varying numbers.

BRIEF DESCRIPTION OF THE DRAWING

FIG. 1 is a perspective view of a conventional stator assembly for a stepping motor.

FIG. 2(a) is an end view of a conventional stator assembly for a stepping motor.

FIG. 2(b) is an end view of a conventional stepping motor with a printed circuit board connector, connected for five leads.

FIG. 5 is a table showing alternative connection arrangements for the connector of the present invention.

DESCRIPTION OF THE PREFERRED EMBODIMENT

Figure 2C:
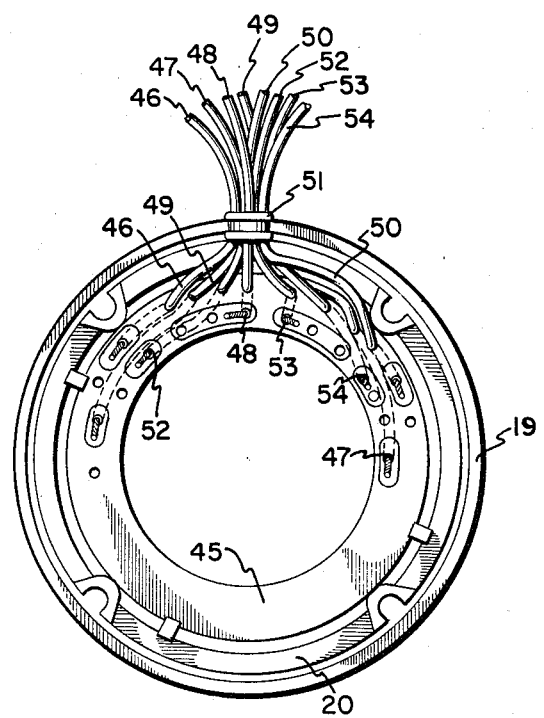
FIG. 2(c) is an end view of a conventional stepping motor with a printed circuit connector board, connected for eight leads.

Referring to the Drawing, FIG. 1 shows a rotary motor shell 10, which may be assumed to be for a two-phase eight-pole stepping motor, with stator poles, as at 11. End forms 12 and 13 are positioned at either end of the stator poles 11 and are configured to provide channels for holding in place magnet wire coils, as at 14, wound upon the stator poles for energization of the stator poles. Motor lead wires 15 are connected (not shown) to the magnet wires of the coils 14 on the stator poles 11.

FIG. 2(a) is a schematic end view of a structure similar to that shown on FIG. 1, with motor shell 19, stator poles 21 through 28, coils 29 through 36, and end form 20. The coils 29 through 36 have terminations 37 through 44. Since the coils are wound for a two-phase motor, two windings comprising the coils on two sets of four poles each are connected. Thus, coils 30, 32, 34, and 36 are connected to form one winding and the coils 29, 31, 33, and 36 are connected to form the other winding. Also, since the windings are bifilar, two magnet wires are wound together in parallel. Thus, in the first winding, the magnet wires with terminations 37 and 38 are wound together around poles 30, 36, 34, and 32 to terminations 41 and 42. A similar arrangement exists for the second winding.

FIG. 2(b) shows the stator structure of FIG. 2(a) with an annular printed circuit board interconnector 45 attached to the end of the end form 20. The printed circuit board 45 has attached to it five external leads 46 through 50, led through a grommet 51 in the motor shell 19 and soldered to connector pads, as at 52. To complete assembly, the following magnet wire/external lead connections would be made: 37 to 49, 38 to 48, 30 to 46, 40 to 48, 41 to 48, 42 to 50, 43 to 48, and 44 to 47.

FIG. 2(c) shows the same stator structure of FIG. 2(a) with the same printed circuit board 45 as in FIG. 2(b), but in an eight external lead configuration. External leads 46 through 50 are connected to the printed circuit board 45 in the same locations as in FIG. 2(b). In addition, external leads 52, 52, and 54 are connected to the printed circuit board 45 as shown. In this case, the magnet wire/external lead connections are as follows: 37 to 49, 38 to 52, 39 to 46, 40 to 48, 41 to 54, 42 to 50, 43 to 53, and 44 to 47. Although there is some commonality of connection between the five-lead and the eight-lead configuration, they are not identical. It will be understood that the relatively complex routing of wires offers opportunities for human error and would make automated assembly difficult. In addition, when the routing of the wires becomes too complex, it is necessary to employ two or more boards having different circuit designs, thus increasing inventory requirements and opportunity for human error.

Figure 3A:
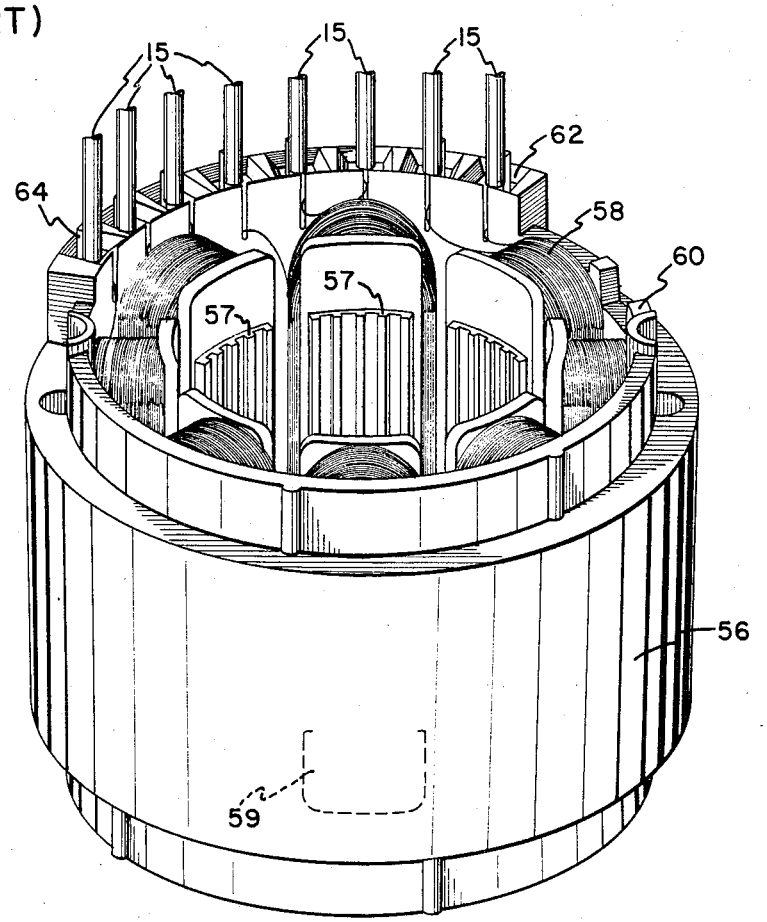
FIG. 3(a) shows a conventional stator assembly for a stepping motor with a mechanical type connector.

FIG. 3(a) shows a stator structure 56 for a shelless eight-pole stepping motor, having integral stator poles, as at 57, with magnet wire coils wound thereon, as at 58, a first end form 59, and a second end form 60 constructed for mechanical-type connections. The end form 60 includes a plurality of sockets, as at 62, into which metal plugs, as at 64, are inserted, making the connections between the magnet wires of the coils 58 and external ll leads 15.

Figure 3B:
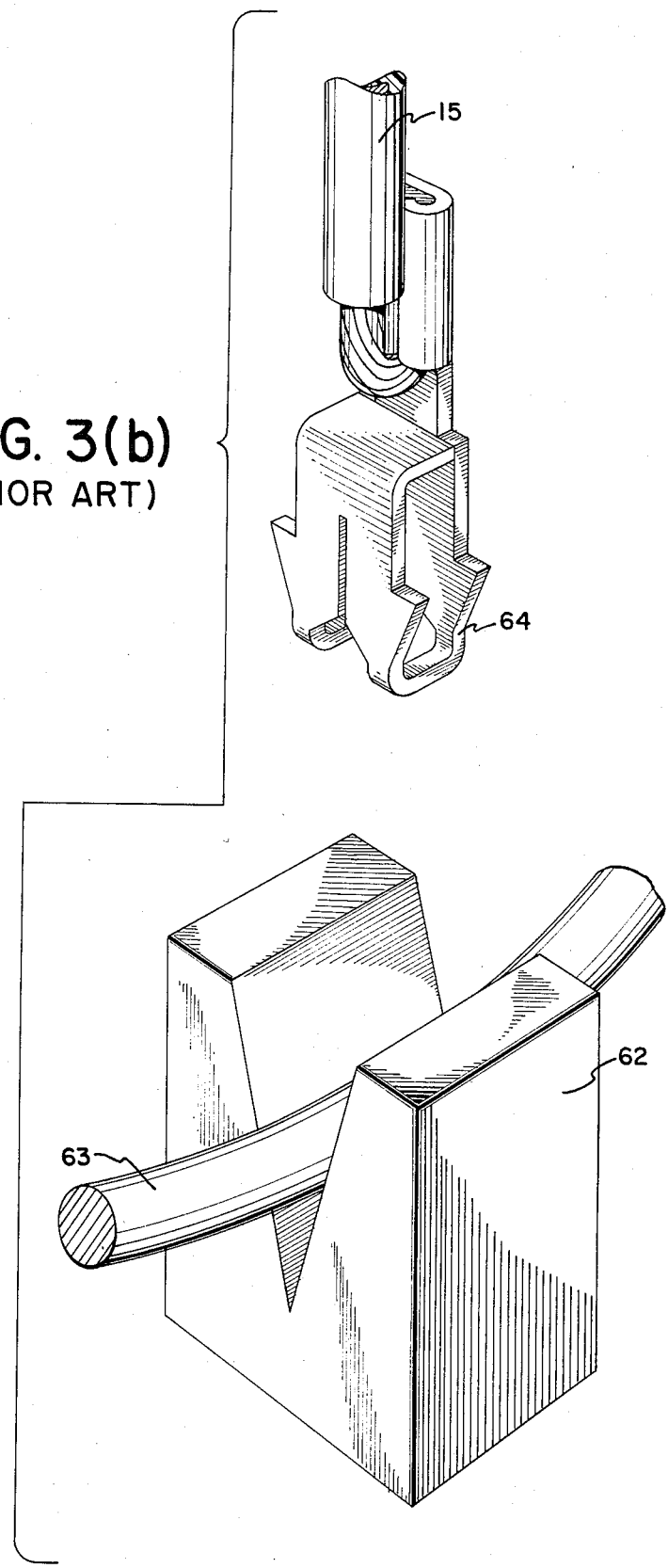
FIG. 3(b) is a detail of the mechanical connector of FIG. 3(a).

FIG. 3(b) shows one of the sockets 62 of the end form 60 shown on FIG. 3(a). A magnet wire 63 to be connected in the socket 62 is palced as shown in grooves in the socket. The metal plug 64 to which is attached external lead 15 is forced over the magnet wire 63 and into the socket 62, thus mechanically attaching the magnet wire and the external lead and retaining the metal plug 64 in the socket 62 by friction.

Figure 4A:
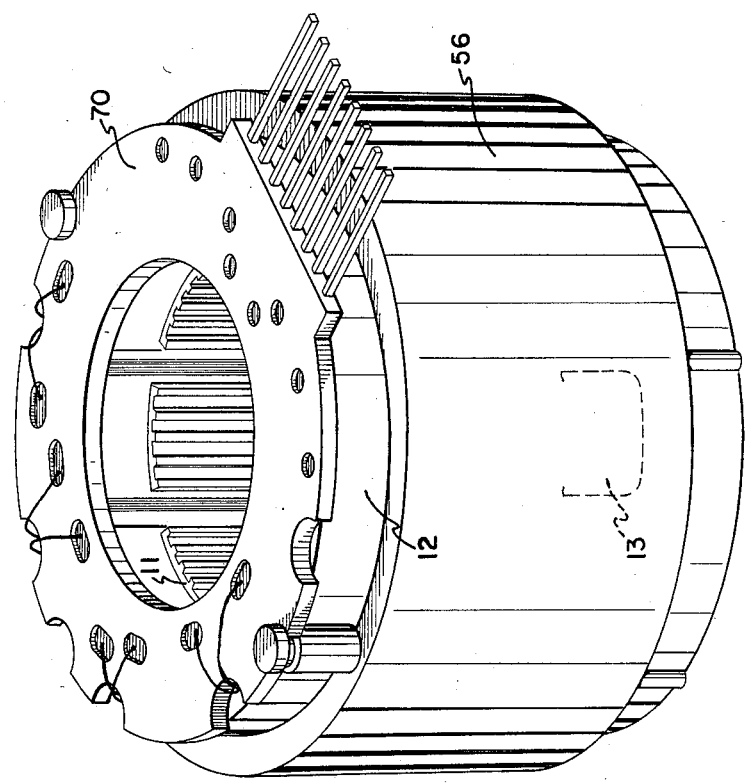
FIG. 4(a) shows a stator assembly for a stepping motor employing the connector of the present invention.

FIG. 4(a) shows a connector of the present invention 70 mounted on the end form 12 of the stator structure shown on FIG. 1.

Figure 4B:
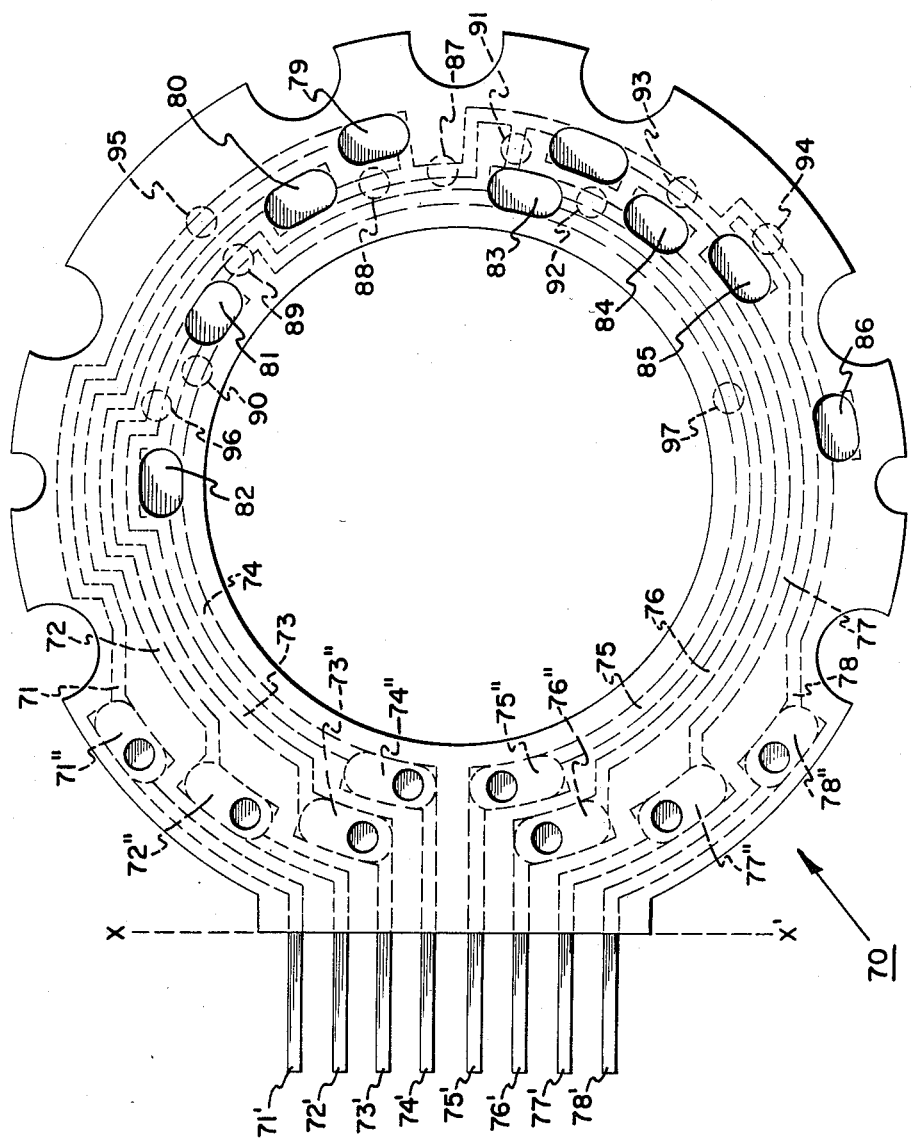
FIG. 4(b) is a plan view of the connector of the present invention.

FIG. 4(b) is an end view of the connector of the present invention 70 constructed for use with the eight-pole stepping motor discussed above. The connector 70 includes conductors 71 through 78 interconnected and laid out in the pattern shown. Although it is not necessary for practicing the invention, it has been found desirable to have these conductors embedded for stability in a high dielectric material, which may conveniently be a high melting point plastic. If desired, the conductors could also be formed on a printed circuit board. The ends of the conductors 71 through 78 form pins 71' through 78' which may be plugged into an external socket for connection to external leads (not shown). As an alternative to the external socket for connection to external leads, the conductors 71 through 78 may be terminated at line X—X' and the external leads (not shown) connected to the conductors at soldering pads 71'' through 78''. Associated with the conductors 71 through 78 are soldering pads 79 through 86 and knockouts 87 through 97, all arranged as shown. The soldering pads 79 through 86 are for connecting motor magnet wires (not shown) to the connector and the knockouts 87 through 94 are for selectively interrupting the continuity of certain of the paths of the conductors 71 through 78, as is further discussed below. A knockout as shown comprises a reinforcing annulus around an exposed portion of a conductor, such that the exposed portion of the conductor may be conveniently removed, thus interrupting the electrical continuity of that conductor.

Figure 4C:
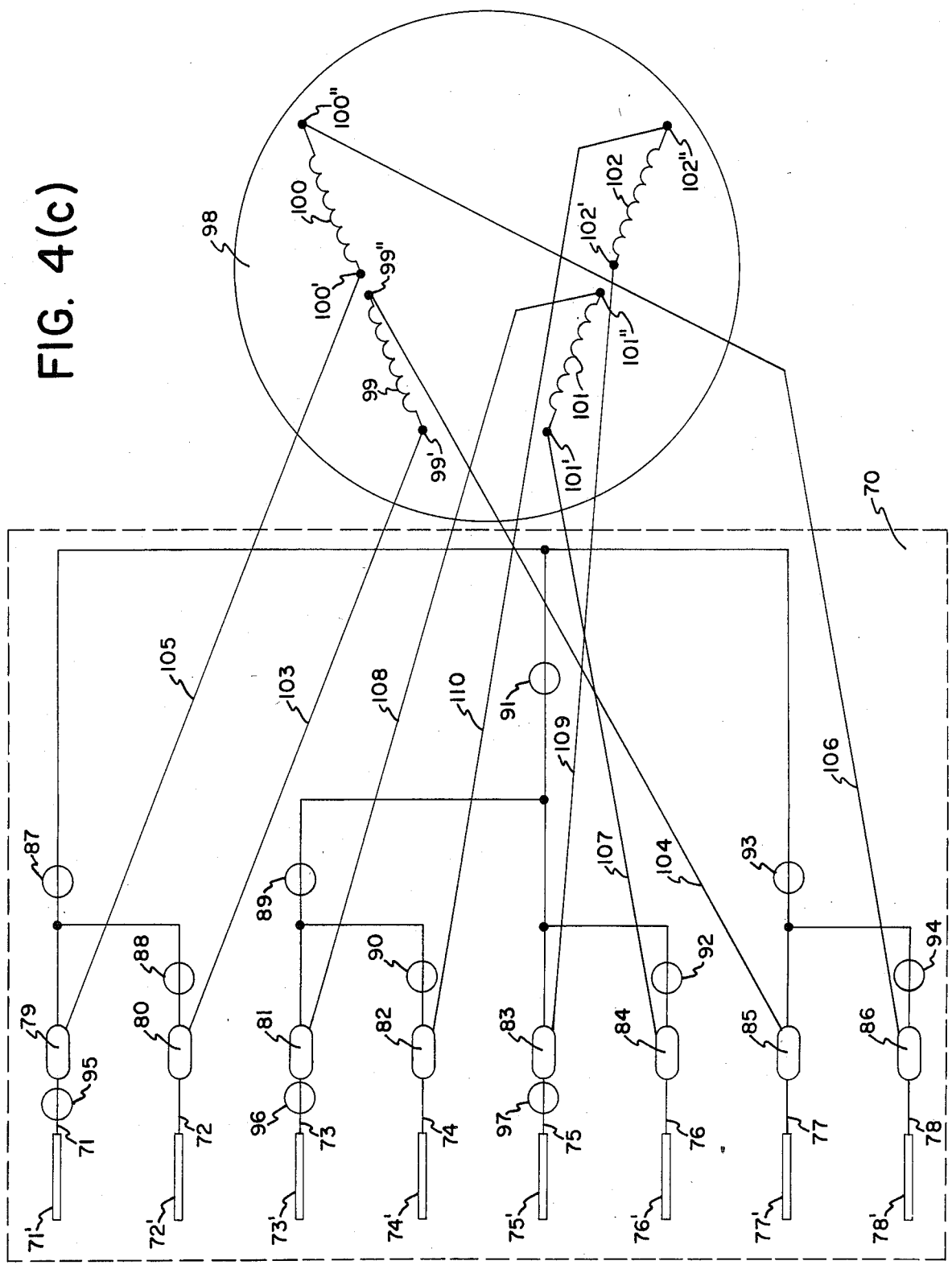
FIG. 4(c) is a schematic of the connector of the present invention connected to a two-phase stepping motor.

FIG. 4(c) is a schematic of the connector 70 associated with a motor stator 98. The motor stator includes windings 99 through 102 having ends 99' and 99'', 100' and 100'', 101' and 101'', and 102' and 102''. When the motor is bifilar wound, as was the motor of FIG. 2(a), windings 99 and 100 are wound parallelly from ends 99' and 100' to ends 99'' and 100''. Similarly, windings 101 and 102 are wound parallelly from ends 101' and 102' to ends 101'' and 102''. The magnet wires forming the windings 99 through 102 do not terminate at ends 99' through 102'' but the ends are led to the connector 70 and soldered to soldering pads 79 through 86, respectively,
with wire 103 connecting winding end 99' and soldering pad 80, wire 103 connecting winding end 99'' and soldering pad 85, with wire 105 connecting winding end 100' and soldering pad 79, with wire 106 connecting winding end 100'' and soldering pad 86, with wire 107 connecting winding end 101' and soldering pad 84, with wire 108 connecting winding end 101'' and soldering pad 81, with wire 109 connecting winding end 102' and soldering pad 83, and with wire 110 connecting winding end 102'' and soldering pad 82.

One of the novel features of the connector is its programmability, in that by removing selected knockouts, the same connector design can be used for 4, 5, 6, or 8 external leads. FIG. 5 is a table showing which knockouts are removed for the various external lead configurations, with "1" indicating that the knockout is left in place and "0" indicating that the knockout is removed. For example, in the five-lead configuration, knockouts 88, 90, 92, and 94 through 97 are removed, thus connecting five conductors, 72, 74, 76, 77, and 78 to the appropriate ends of the windings 99 through 102, as shown. The eight-, six-, and five-lead hookups are for bifilar wound motors. The four-lead hookup indicated in FIG. 5 is for a monofilar wound motor which is the usual winding for four leads. Some of the knockouts on FIG. 5 are shown as always being removed; however, some or all of these would be left in place for other winding configurations not discussed above.

An important feature of the connector is that the motor magnet wires are always connected to the same places on the connector for any number of external leads, so that the opportunity for error is reduced. Additionally, the less complex routing of magnet wires and the absence of lead wire connections greatly facilitate automatic assembly. When no lead wires are connected to the connector, automatic insertion of the motor assembly into other equipment is also facilitated.

It will be understood that what has been disclosed is a physically programmable electrical connector suitable for connecting the internal conductors of an electrical device to any number of external connectors. While the invention has been described, for convenience, as applied to a stepping motor of a particular configuration, it will be readily understood by one skilled in the art that it may be applied as well to stepping motors of other configurations, to other types of motors, and to other types of electrical devices, such as multiple-tap transformers and variable-throw solenoids, in which it is desired to be able to connect a number of internal conductors, or, more generally, to any case where it is desired to have one connector capable of connecting two sets of conductors of varying numbers.

Since certain changes may be made in carrying out the above invention without departing from the scope thereof, it is intended that all matter contained in the above description or shown in the accompanying Drawing shall be interpreted as illustrative and not in a limiting sense.

It is also intended that the following claims are intended to cover all of the generic and specific features of the invention herein described, and all statements of the scope of the invention which, as a matter of language, might be said to fall therebetween.

We claim:

1. A programmable connector to electrically connect the magnet wires of an electric motor to external leads, which motor may have at least two different winding configurations, comprising:
   (a) a substrate configured as a centrally-apertured disk adapted to be mounted to one end of the motor;
   (b) a first plurality of interconnected conductive paths in substantially planar spaced relationship on a surface of, or within, the substrate;
   (c) means for attaching to the conductive paths a second plurality of the magnet wires, each magnet wire being attached to a specific point on a conductive path;
   (d) means for attaching to the conductive paths a third plurality of the external leads, each external lead being connected to a specific point on a conductive path; and
   (e) means to provide for causing electrical discontinuities in some of the conductive paths, such that the magnet wires become electrically connected to the external leads in a predetermined pattern;
whereby, a single connector design may be used to connect different second and different third pluralities, depending upon the discontinuities caused, regardless of the motor winding configuration.

2. A connector, as defined in claim 1, wherein the first plurality of conductive paths is embedded in a high-dielectric plastic material substrate.

3. A connector, as defined in claim 1, wherein the first plurality of conductive paths is formed on a printed circuit board substrate.

4. A connector, as defined in claim 1, wherein the first plurality of conductive paths comprises a single metal stamping.

5. A connector, as defined in claims 1, 2, 3, or 4, wherein the means for attaching the magnet wires comprises soldering pads formed on the conductive paths.

6. A connector, as defined in claims 1, 2, 3 or 4, wherein the means for attaching the external leads comprises soldering pads formed on the conductive paths.

7. A connector, as defined in claims 1, 2, 3, or 4, wherein the means for attaching the external leads comprises having pins formed on the ends of the conductive paths to which pins a connector contining the leads may be attached.

8. A connector, as defined in claim 2, wherein the means to provide for causing discontinuities in the conductive paths comprises a plurality of holes in the plastic material, each such hole being positioned to expose a portion of a single conductive path such that that portion of the conductive path may be removed, thus causing an electrical discontinuity in that conductive path.

9. A programmable connector to electrically connect the magnet wires of an electric motor to external leads, which motor may have at least two different winding configurations, comprising:
   (a) a substrate configured as a centrally-apertured disk adapted to be mounted to one end of the motor;
   (b) a first plurality of interconnected conductive paths, annularly spaced apart, in substantially planar spaced relationship on a surface of, or within, the substrate;
   (c) soldering pads formed on the conductive paths for attaching a second plurality of magnet wires to the conductive paths, each magnet wire being attached to a specific point on a conductive path;
   (d) means for attaching to the conductive paths a third plurality of external leads, each external lead being connected to a specific point on a conductive path; and
   (e) means to provide for causing electrical discontinuities in some of the conductive paths, such that the magnet wires become electrically connected to the external leads in a predetermined pattern;
whereby, a single connector design may be used to connect different second and different third pluralities, depending upon the discontinuities caused, regardless of the motor winding configuration.

10. A connector, as defined in claim 9, wherein the substrate comprises a high-dielectric plastic material in which the first plurality of conductive paths is embedded, adapted to be mounted adjacent an end form of the motor.

11. A connector, as defined in claim 9, wherein the means to provide for causing discontinuities in the conductive paths comprises a plurality of holes in the substrate, each hole being positioned to expose a portion of a single conductive path such that that portion of the conductive path may be removed, thus causing an electrical discontinuity in that conductive path.

12. A connector, as defined in claims 9 or 11, wherein the first plurality of conductive paths is formed on a printed circuit board substrate adapted to be mounted adjacent an end form of the motor.

13. A connector, as defined in claims 9, 10, or 11, wherein the first plurality of conductive paths comprises a single metal stamping.

14. A connector, as defined in claims 9, 10, or 11, wherein the means for attaching the leads comprises soldering pads formed on the conductive paths.

15. A connector, as defined in claim 9, 10, or 11, wherein the means for attaching the leads comprises having pins formed on the ends of the conductive paths to which pins a connector containing the leads may be attached.

* * * * *